United States Patent
Aoki et al.

(10) Patent No.: US 12,315,775 B2
(45) Date of Patent: May 27, 2025

(54) UNDERFILL VACUUM PROCESS

(71) Applicant: INTERNATIONAL BUSINESS MACHINES CORPORATION, Armonk, NY (US)

(72) Inventors: Toyohiro Aoki, Yokohama (JP); Chinami Marushima, Urayasu (JP); Risa Miyazawa, Isehara (JP); Akihiro Horibe, Yokohama (JP); Takashi Hisada, Hachiouji (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 842 days.

(21) Appl. No.: 17/543,072

(22) Filed: Dec. 6, 2021

(65) Prior Publication Data

US 2023/0178445 A1 Jun. 8, 2023

(51) Int. Cl.
*H01L 21/67* (2006.01)
*H01L 21/56* (2006.01)
*H01L 23/00* (2006.01)
*H01L 23/31* (2006.01)

(52) U.S. Cl.
CPC ........ *H01L 23/3157* (2013.01); *H01L 21/563* (2013.01); *H01L 21/67126* (2013.01); *H01L 24/73* (2013.01); *H01L 2224/73204* (2013.01)

(58) Field of Classification Search
CPC ................ H01L 21/67126; H01L 21/563
See application file for complete search history.

(56) References Cited

U.S. PATENT DOCUMENTS

| 5,998,242 A | 12/1999 | Kirkpatrick et al. |
| 6,048,656 A | 4/2000 | Akram et al. |
| 7,753,253 B2 | 7/2010 | Terada et al. |

(Continued)

FOREIGN PATENT DOCUMENTS

| CN | 103109361 A | 5/2013 |
| JP | H11219976 A | 8/1999 |

(Continued)

OTHER PUBLICATIONS

International Search Report issued in corresponding PCT Application Serial No. PCT/IB2022/058065 dated Dec. 20, 2022, p. 1-8.

(Continued)

*Primary Examiner* — Errol V Fernandes
(74) *Attorney, Agent, or Firm* — Tutunjian & Bitetto, P.C.; Robert Richard Aragona

(57) ABSTRACT

An electronic device is formed by dispensing an underfill material around a perimeter of an integrated circuit (IC) chip bonded to a supporting substrate. A void in present in the underfill material that is present between the IC chip and the supporting substrate. An opening is present through at least one of the IC chip and the supporting substrate into communication with the void. A vacuum may be applied to the void through the opening that is present through the IC chip to reduce a size of the void to a first volume. The opening that is present through the IC chip is sealed with a sealing plate. The underfill material is cured after the sealing of the opening to reduce of the void to at least a second volume that is less than the first volume.

8 Claims, 7 Drawing Sheets

(56) References Cited

U.S. PATENT DOCUMENTS

| | | | |
|---|---|---|---|
| 8,651,359 B2* | 2/2014 | Gaynes | H01L 24/75 228/49.5 |
| 9,314,882 B2 | 4/2016 | Babiarz et al. | |
| 11,574,848 B2* | 2/2023 | Horibe | H01L 21/67121 |
| 2002/0192876 A1* | 12/2002 | Boyaud | H01L 23/3128 257/E21.503 |
| 2006/0016541 A1* | 1/2006 | Caskey | H01L 24/81 257/E21.511 |
| 2009/0229513 A1 | 9/2009 | Hisada et al. | |
| 2010/0079957 A1* | 4/2010 | Houle | H01L 23/3142 361/709 |
| 2010/0255641 A1 | 10/2010 | Nakanishi et al. | |
| 2011/0247852 A1* | 10/2011 | Simion | H01L 24/743 174/17.05 |
| 2011/0300673 A1 | 12/2011 | Mercado et al. | |
| 2012/0032328 A1 | 2/2012 | Lin et al. | |
| 2012/0068353 A1* | 3/2012 | Huang | H01L 23/49816 257/774 |
| 2013/0115735 A1* | 5/2013 | Chen | B29C 43/18 257/E21.705 |

FOREIGN PATENT DOCUMENTS

| | | |
|---|---|---|
| KR | 20130035469 A | 4/2013 |
| WO | 2014025487 A1 | 2/2014 |

OTHER PUBLICATIONS

Anonymous, "Hinge Type Autoclave HP-505," Sep. 2021, http://www.kyosin-eng.com/en/index.php/56, 1 page.

Anonymous, "Quantum Q-6800 High-Value Fluid Dispensing System," Sep. 2021, https://www.nordson.com/en/divisions/asymtek/products/fluid, 2 pages.

Anonymous, "Toray NUS100," Sep. 2021, https://www.c2mi.ca/en/equipement/toray-nus 100/, 2 pages.

Anonymous, "Manual vacuum hot plate chamber PH222 series," Dec. 2021, https://msa-factory.co.jp/product/ ph222/, 4 pages.

Anonymous, "Structure and method to improve SMT passive component and package reliability," Mar. 2020, https://ip.com/IPCOM/000261485, 6 pages.

Horibe, A, et al., "Vacuum underfill technology for advanced packaging," 2011 IEEE 61st Electronic Components and Technology Conference (ECTC), IEEE, May 2011, pp. 1003-1008.

* cited by examiner

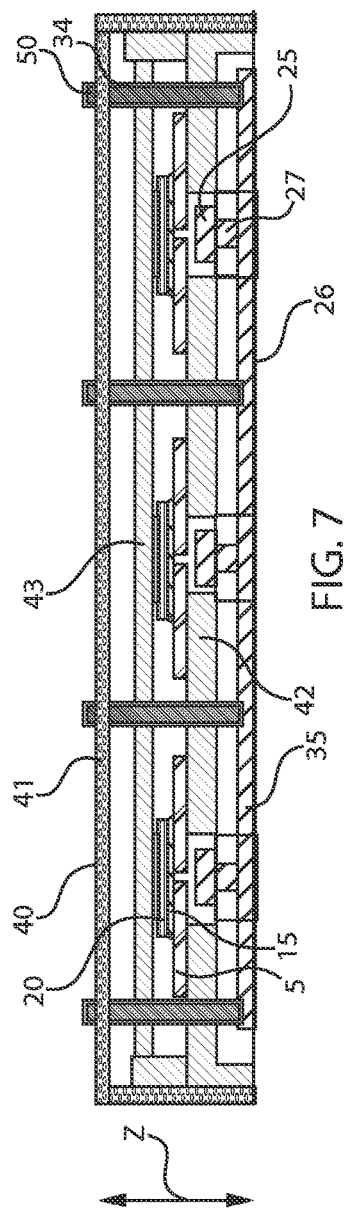
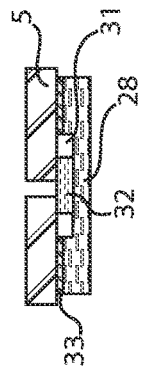
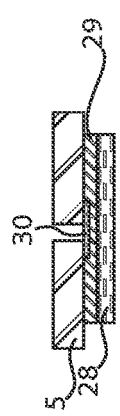
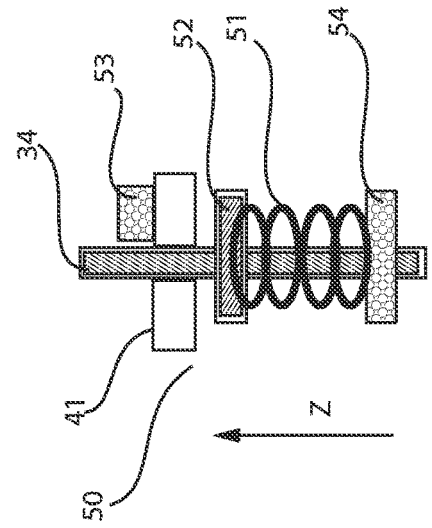
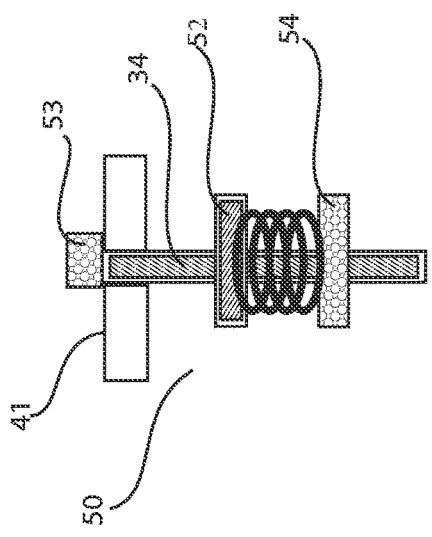

UNDERFILL VACUUM PROCESS

BACKGROUND

The present disclosure relates to solder joints between connectors and electrical devices, and more particularly to underfill processes employed informing solder joints.

The use of underfill enables structural coupling of the chip and substrate, effectively decreasing the shear stress and thus lowering the applied strain on the solder joints. However, underfill voids can form during the underfill process. An underfill void is a defect that causes reliability issues. The presence of a void between solder bumps, i.e., solder balls of a solder joint, can cause solder pumping, which can result in an electrical short of open in the device including the underfill. Further, the void can cause stress concentrations resulting in crack formation or delamination.

Voidless underfilling is becoming more difficult due to a number of trends in device manufacturing. For example, larger chips are more susceptible to void formation. Devices having a finer pitch and narrower gap between device features are also more likely to include voids during the underfill process. Additionally, complex devices, such as devices including direct bonded heterogenous integration (DBHi) have also been found to be likely to include underfill voids. In view of the above, a need exists for providing a more uniform underfill process that eliminates void formation.

SUMMARY

In some embodiments, the method, apparatuses and structures provided herein can provide for uniform and potentially voidless underfill materials in solder bonded devices through mechanisms that can apply a vacuum during in the process flow beginning with underfill deposition and continuing to thermal curing of the underfill.

In one embodiment, a method of fabricating an electronic device is described that includes dispensing an underfill material around a perimeter of an integrated circuit (IC) chip bonded to a supporting substrate. A void in present in the underfill material that is present between the IC chip and the supporting substrate. An opening is present through at least one of the IC chip and the supporting substrate into communication with the void. A vacuum may be applied to the void through the opening that is present through the IC chip to reduce a size of the void to a first volume. The opening that is present through the IC chip is sealed with a sealing plate. The underfill material is cured after the sealing of the opening to reduce of the void to at least a second volume that is less than the first volume.

In one embodiment, the curing continues until the void in the underfill material is entirely removed.

In another embodiment, the method of fabricating the electrical device includes dispensing an underfill material around a perimeter of an integrated circuit (IC) chip bonded to a supporting substrate, wherein a void in the underfill material is present between the IC chip and the supporting substrate, and an opening is present through at least one of the IC chip and the supporting substrate into communication with the void. The method may further include applying a vacuum to the void through the opening that is present through the IC chip to reduce a size of the void to a first volume; and sealing the opening with a sealing plate and at least one solder actuator. The at least one solder actuator includes at least one spring for moving the sealing plate. In some embodiments, the method can further include curing the underfill material after the sealing of the opening to reduce of the void to at least a second volume that is less than the first volume. The solder actuator has some advantages when employed in vacuum chambers that do not include electric connections for powering servo motors.

In another aspect, an apparatus for removing voids from underfill material is provided during the formation of electrical devices. In one embodiment, the apparatus for forming an electrical device includes a tray fixture for housing an assembly of an integrated circuit engaged to a support substrate by solder bond and an underfill material. The tray fixture includes an aperture to expose at least one vacuum opening in the assembly. The apparatus for forming the electrical device may further include a sealing plate positioned to be inserted into the aperture, and at least one actuator connected to the tray fixture and the sealing plate to move the sealing plate into engagement with the at least one vacuum opening in the assembly.

In one embodiment, the at least one actuator includes at least one guide pin connected to the tray fixture and the sealing plate; and a spring for moving the sealing plate through the aperture in the tray fixture. The at least one actuator further includes a spring retainer on the at least one guide pin for connecting the spring to the at least one guide pin; and a spring set bar on the tray fixture for connecting the spring to the tray fixture.

In some embodiments, the actuator does not need electrical signal to actuate the sealing plate into sealing engagement with the vacuum opening in the assembly. In some embodiments, the actuator may be a solder actuator. The solder actuator can provide that the spring in compressed when the solder is in a solid state, and the sealing plate is separated from the at least one vacuum opening. The solder actuator can also provide that the spring is decompressed when the solder is in a liquid state. When the solder is in a liquid state, the sealing plate is engaged to the at least one vacuum opening.

In one example, the apparatus for forming an electrical device includes a tray fixture for housing an assembly of an integrated circuit engaged to a support substrate by solder bond and an underfill material, wherein the tray fixture includes an aperture to expose at least one vacuum opening in the assembly. The apparatus also includes a sealing plate positioned to be inserted into the aperture; and at solder actuator connected to the tray fixture and the sealing plate to move the sealing plate into engagement with the at least one vacuum opening in the assembly.

In yet another aspect, an electrical device is provided that includes an integrated circuit chip and a supporting substrate connected by solder bonds. A vacuum opening is present through at least one of the integrated circuit chip and the packaging substrate. In some embodiments, an underfill material filling a space between the integrated circuit chip and the supporting substrate, wherein the underfill material fills the vacuum opening.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which:

FIG. 7 is a side cross-sectional view of an apparatus for engaging a sealing plate to the slit/opening in the substrate of the IC chip, which can be a component of a tray or fixture in the vacuum chamber, in accordance with one embodiment of the present disclosure.

FIG. 8 is a magnified side cross-sectional view of a first embodiment of a plate engaged in sealing engagement to the slit/opening of the IC chip.

FIG. 9 is a magnified side cross-sectional view of a second embodiment of a plate that includes a ridge at its perimeter and a centrally positioned trench, in which the plate engaged in sealing engagement to the slit/opening of the IC chip.

FIG. 10 is a side cross-sectional view of actuator with a lock in the closed position, in accordance with one embodiment of the present disclosure.

FIG. 11 is a side cross-sectional view of an actuator with the lock in the open position, in accordance with one embodiment of the present disclosure.

DETAILED DESCRIPTION OF THE PREFERRED EMBODIMENTS

Figure 1:
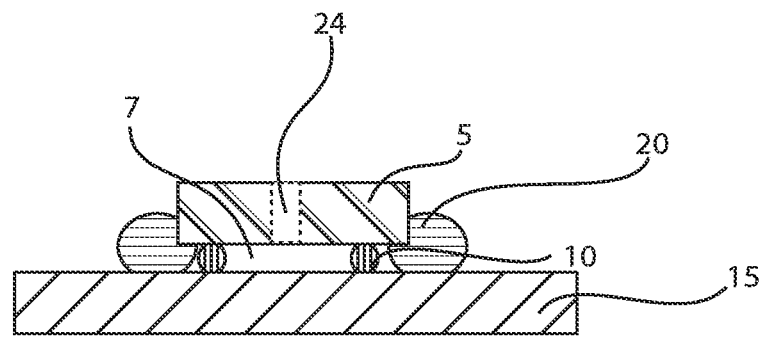
FIG. 1 is a side cross sectional view illustrating solder bonding of an integrated circuit (IC) chip to a supporting substrate, and depositing an underfill material, in which a void is present in the underfill, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The methods and structures described herein provide for forming underfill materials to structures including electrical connection using solder joints while minimizing or eliminating the formation of underfill voids. The methods and structures described herein can provide an underfill process without a special tool and extra area for dispensing the underfill material. In some embodiments, the methods and structures of the present disclosure employs slits and/or holes that are fabricated in a substrate to which the solder joint is formed. In some embodiments, in which the solder joint containing structure includes two substrate, the slits and/or holes may be formed in a top or bottom substrate, or in both the top and bottom substrate. In some embodiments, when forming the underfill, the underfill is dispensed to fill the gap between substrates, and forms a fillet. The fillet is formed at atmospheric pressure. Forming the fillet may be performed at room temperature or elevated temperature, and forming the fillet does require a vacuum environment.

In a following step, the structure including the filet of underfill material is set in a vacuum chamber. The vacuum environment is applied before the slit and/or holes that are present in the substrate is filled with underfill material. As the vacuum is applied, the underfill can flow further filling the space between the two structures being connected by the solder joints positioned therebetween. At this stage the flow of the underfill material can be characterized as a capillary effect. Additionally, during the stages at which the vacuum is applied the temperature may be elevated to further assist the flow of the underfill material, which reduces the size of any voids.

In a following step, after the application of the vacuum, the slit and/or hole is capped. Once the slit and/or hole is capped, and any remaining void is sealed, the vacuum applied may be removed, and the pressure of the assembly can return to atmospheric pressure.

An underfill curing process may also be applied at atmosphere pressure or in a high pressure environment. During the underfill curing process, the void size may be even further reduced and/or eliminated. In addition to method for reducing the incidence of voids, apparatus are also provided that can provide the process sequence described above, including the application of plates for sealing the slit and/or holes following the application of the vacuum.

The methods and structures of the present disclosure are now described in further detail with reference to FIGS. 1-20.

FIG. 1 illustrate one embodiment of an integrated circuit (IC) chip 5 being solder bonded to a supporting substrate 15 (also referred to as supporting carrier), such as a printed circuit board (PCB). An integrated circuit or monolithic integrated circuit (also referred to as an IC, a chip, or a microchip) is a set of electronic circuits on one small flat piece (or "chip") of semiconductor material. The semiconductor material may be a type IV semiconductor, such as silicon (Si), or may be a type III-V semiconductor material, such as Gallium arsenic (GaAs). Large numbers of field effect transistors (FETs), e.g., MOSFETs (metal-oxide-semiconductor field-effect transistors), cab be integrate into the chip. The types of semiconductor devices, e.g., FETs, can include horizontally orientated devices, vertically orientated devices, Fin-type field effect transistors, nanowire and/or nanosheet channel type devices. Any field effect transistor (FET), e.g., a gate structure including a channel separating source and drain region, may be integrated into the chip. The above examples of FET types is provided for illustrative purposes only, and is not intended to be limiting.

The printed circuit board (PCB) 15 includes electrical contact pads and pathways to bring electrical signal to the IC chip 5 that is bonded thereto. The printed circuit board (PCB) 15 may be a metal core printed circuit board (MCPB). In some embodiments, other materials, such as FR4 can also be employed. It is noted that the supporting substrate 15 may also a semiconductor wafer, e.g., another silicon substrate.

The electrical connection between the integrated circuit (IC) chip 5 and the supporting substrate 15 may be a solder type bond, such as a solder bump 10, solder ball, etc. Traditionally, solder bumps 10 (also referred to as "solder balls"), such as C4 (controlled collapse chip connection) bumps, have been used to bond a chip to a chip carrier. The term "solder", as used herein, refers to any metal or metallic compound or alloy that is melted and then allowed to cool in order to join two or more metallic surfaces together. The plurality of solder bumps 10 may be composed of a metal suitable for soldering. For example, in some embodiments, the solder bumper 10 may be composed of a eutectic alloy of tin and lead or a lead free solder composition. In some embodiments, the solder joints having a height ranging from 0.5 mm to 3 mm. In other examples, the solder bumps 10 have a height greater than 1 mm. In some embodiments, the array of solder bumper 10 may have a total area greater than 30 mm×200 mm.

Generally speaking, solders have melting temperatures in the range of 150° C. to 250° C. Solder bumps may be small spheres of solder (solder balls) that are bonded to contact areas, interconnect lines or pads of semiconductor devices. In some embodiments, the solder bumps can be made from lead-free solder mixtures or lead tin solder.

Under ball metallurgy (UBM) is a solder wettable terminal metallurgy that defines the size and area of the soldered connection between the solder ball and the component that the solder ball is to be place in electrical communication with. The UBM limits the flow of the solder ball to the desired area. In some embodiments, the UBM provides adhesion and contact to the chip wiring. In some examples, the UBM may include an adhesive layer, a barrier layer and a conductive layer that provides a path for interconnection between the device back end of line structures, and the electrical structures to be connected to the device back end of the line structures, using a solder bump. The adhesive layer, the barrier layer and the conductive player provide a path for interconnection between the device and the chip. The adhesive layer can be metals like titanium (Ti) or an alloy of titanium (Ti) and tungsten (W). The barrier layer can be composed of nickel (Ni). The main conductive layer is typically copper (Cu). A typical plated BLM layer may consist of a metal stack including a sputtered Ti and W alloy layer, a sputtered Cu layer, a plated Ni layer and a plated Cu layer. This process includes subtractive etching of the copper seed layer. In this process, some of the top layer of copper is etched by the wet etch process. When improvements in electromigration are needed, a Cu layer is introduced under the 2 microns of nickel to improve the current distribution and reduce the peak current density. The Cu layer is then plated first to a thickness of 10 microns, followed by a Ni layer of 2 microns, and a top Cu layer.

It is noted that the above metallurgy described for the solder bumper 10 is provided for illustrative purposes only, and is not intended to limit the present disclosure solely thereto.

Still referring to FIG. 1, an underfill material 20 is depicted as it has been dispensed to the perimeter of the area where the IC chip 5 is bonded to the supporting substrate 10 (also referred to as chip carrier), which may be a printed circuit board. An "underfill" is a composite material made up of an epoxy polymer with significant amounts of filler. Additional components added to the underfill 20 formulation are flow agents, adhesion promoters, and dyes.

In some embodiments, the underfill 20 can be epoxy based resin. In some examples, the underfill 20 can be epoxy resin with filler, epoxy acrylate with filler, or polymer with proper filler. The underfill 20 is non-conductive. In some examples, epoxy resin formulations that may be suitable for the underfill 20 can include, for example, high purity diglycidyl ether of bisphenol F or diglycidyl ether of bisphenol A along with high performance or multifunctional resins, such as the digylcidyl ether of naphthalene diol or the triepoxide of para-aminophenol. It is noted that this is only one example of an epoxy composition that may be used as the underfill 20 of the present disclosure. Other compositions, and other epoxy based resins, are equally suitable for the underfill 20.

The underfill 20 has a composition to strengthen the mounting of the IC chip 5 to the supporting substrate 15. The underfill 20 composition has dielectric properties and also electrically isolates the solder bumps 10 from one another.

As depicted in FIG. 1, the underfill 20 is deposited around a perimeter of the integrated circuit chip 5. The underfill 20 may be deposited using an injection process, e.g., inkjet type printing technology. The underfill 20 may be deposited at atmospheric pressure.

The underfill 20 may be deposited at room temperature.

In the example depicted in FIG. 1, the underfill 20 is present around a perimeter of the chip, however a noticeable void is centrally positioned between the IC chip 5 and the supporting substrate 15. In the example depicted in FIG. 1, the void extend from a first solder bump 10 on a first side of the IC chip 5 to a second solder bump 10 on a second side of the IC chip 5.

As will be described in further detail below, to remove the void, a process flow is provide in which a vacuum is applied to pull the underfill material 20 from edges of the IC chip 5 towards a central portion of the IC chip. To apply the vacuum, a slit/opening 6 is present through the substrate of the IC chip 5. As illustrated, the slit/opening 6 extends from an upper surface of the IC chip 5, and goes through an entirety of the IC chip 5. In this example, the slit/opening 6 is centrally located relative to the width of the IC chip 5, and therefore is positioned to be in communication with the void 7 in the underfill 20.

In some embodiments, the slit/opening 6 can be combined with cavity structures. For example, the opening/slit 6 can be formed in a molded package or a fanout wafer level package. "Fan-Out" packaging can be defined as any package with connections fanned-out of the chip surface, enabling more external I/Os. Fan-out packages can use an epoxy mold compound to fully embed the dies, rather than placing them upon a substrate or interposer. Fan-Out packaging can involve dicing chips on a silicon wafer, and then positioning the chips on a thin "reconstituted" or carrier wafer/panel, which is then molded and followed by a redistribution layer (RDL) atop the molded area (chip and fan-out area), and then forming solder balls on top.

Si chips are sometime integrated already like molded packaged or fanout wafer level package before they are attached on laminate. In such cases, the slit/opening 6 can be formed in molded package or fanout wafer level package instead of silicon chips (IC chip 5) or laminate (e.g., support substrate 5).

The void 7 is an air gap. By applying the vacuum through the slit/opening, the air cap is evacuated, which draws the underfill material 20 from the from edges of the IC chip 5 towards a central portion of the IC chip 5.

Figure 2:
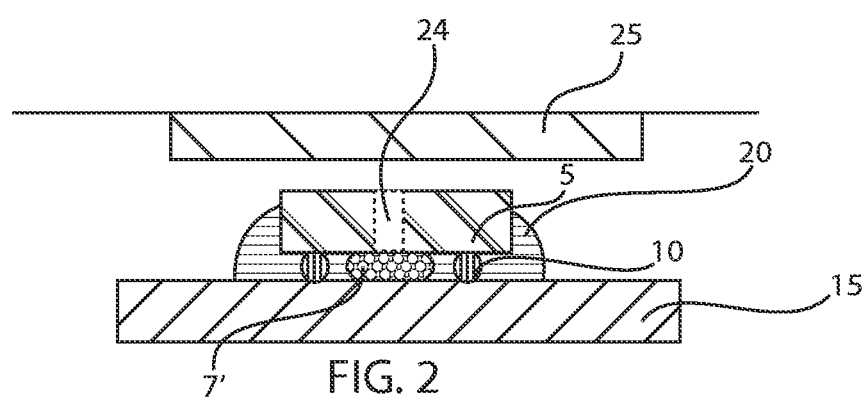
FIG. 2 is a side cross-sectional view that illustrates the flow in a vacuum chamber for drawing underfill material from the from edges of the IC chip towards a central portion of the IC chip, wherein a vacuum can be applied to the void in the underfill through a slit/opening in the substrate of the IC chip, in accordance with one embodiment of the present disclosure.

FIG. 2 illustrates the flow in a vacuum chamber that is drawing the underfill material 20 from the from edges of the IC chip 5 towards a central portion of the IC chip 5. As illustrated the substantially circular cross-sectional geometry of the underfill material 20 at the perimeter of the IC chip 5 is being modified by the pull of the vacuum. By drawing the underfill material 20 towards the central portion of the IC chip 5, the air gap is evacuated, and the void is reduced in size, as illustrated by comparison of the void 7 prior to the application of the vacuum in FIG. 1 with the void 7' during the application of the vacuum in FIG. 2. The vacuum chamber is a rigid enclosure from which air and other gases are removed by a vacuum pump. This results in a low-pressure environment within the chamber, commonly referred to as a vacuum. For comparison purposes atmospheric pressure is approximately 760 Torr. In some embodiments, the application of the vacuum produces a low vacuum ranging from 760 Torr to 25 Torr. In some embodiments, the application of the vacuum produces a medium vacuum ranging from 25 to $1 \times 10^{-3}$ Torr, which can draw the underfill material 20 from the edges of the IC chip 5 towards a central portion of the IC chip 5. In some embodiments, the application of the vacuum produces a high vacuum (Hard) ranging from $1 \times 10^{-3}$ Torr to $1 \times 10^{-9}$ Torr, which can draw the underfill material 20 from the from edges of the IC chip 5 towards a central portion of the IC chip 5. In some embodiments, the application of the vacuum produces an Ultra High Vacuum $1 \times 10^{-9}$ to $1 \times 10^{-12}$ Torr, which can draw the underfill material 20 from the from edges of the IC chip 5 towards a central portion of the IC chip 5. In one example, the medium vacuum is preferred.

The underfill material 20 flow may be further facilitated by capillary action. Additionally. The temperature within the vacuum chamber may be elevated. For example, if room temperature ranges from 20° C. to 25° C., an elevated temperature for increasing flow of the underfill material in the vacuum environment may range from 70° C. to 130° C. A furnace element may be present within the vacuum chamber to provide temperature elevation.

Figure 3:
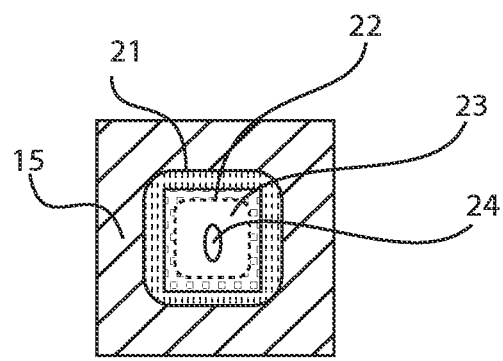
FIG. 3 is a top down planar view of the IC chip bonded to the supporting substrate following depositing the underfill material and applying the vacuum, as described in FIG. 2.

FIG. 3 is a top down planar view of the IC chip bonded 5 to the supporting substrate 15 following depositing the underfill material 20 and applying the vacuum. The underfill material has an outer perimeter identified by reference number 21, and an inner perimeter identified by reference number 22. The void is present in the area identified within the inner perimeter identified by reference number 23. The slit/opening is identified by reference number 24. Although the slit/opening 24 is depicted with an oval like shape, the slit/opening 24 may have a circular geometry. Although only one slit/opening 24 is depicted, it is noted that the present application is not limited to only this example. There may be multiple openings for the purposes of applying the vacuum.

Figure 4:
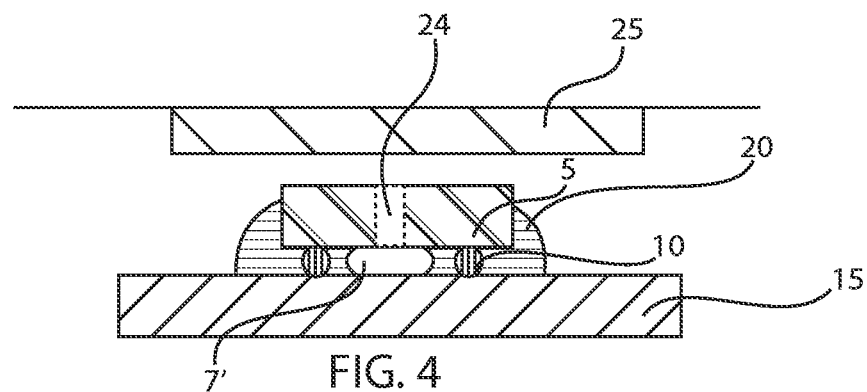
FIG. 4 is a side cross-sectional view of capping the slit/opening through the substrate of the IC, while the structure is present in a vacuum.

FIG. 4 illustrates the at least one hole or slit 24 being capped and closed by plates 25 that seal the hole/slit in the presence of the vacuum. The plates 25 may include a plug or sealing element that consist of one of PTFE, adhesive, rubber, hard inorganic materials and combinations thereof. The plates 25 can be embedded in a tray or fixture assembly within the vacuum chamber. After capping the slit/opening 24, the environment is changed from vacuum to atmospheric pressure. Atmospheric pressure is approximately 760 Torr.

Figure 5:
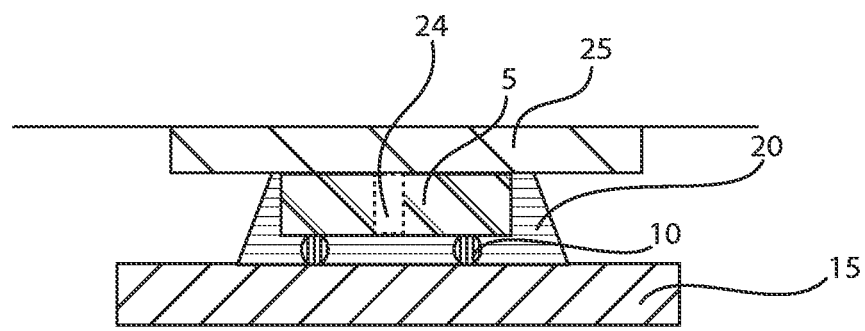
FIG. 5 is a side cross-sectional view of adjusting the vacuum of the structure depicted in FIG. 4 to atmospheric pressure and applying an underfill cure.

FIG. 5 illustrates one embodiment of the structure following curing. Underfill cure process is done in atmospheric pressure or high-pressure environment. In some embodiments, Curing takes place at a temperature typically between 130° C. and 160° C., although "snap cures" may cure in a few seconds. Atmospheric pressure is approximately 760 Torr. In some embodiments, the high pressure curing includes a pressure ranging from 1520 to 7600 Torr. Cure time may be less than a few minutes and in some instances as low as a few seconds.

Figure 6:
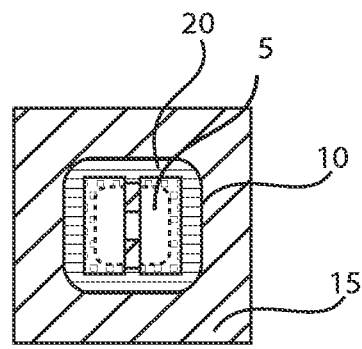
FIG. 6 is a top down planar view of the IC chip bonded 5 to the supporting substrate 15 following capping the slit/opening 24, adjusting the pressure to atmospheric pressure, and performing the high temperature curing.

The steps of capping the slit/opening 24, adjusting the pressure to atmospheric pressure, and performing the high temperature curing of the underfill 30, causes the underfill to further fill the void that is present between the IC chip 5 and the supporting substrate 10. FIG. 6 is a top down planar view of the IC chip bonded 5 to the supporting substrate 15 following capping the slit/opening 24, adjusting the pressure to atmospheric pressure, and performing the high temperature curing. Referring to FIGS. 5 and 6, the underfill material has entirely filled the void was present in the area identified within the inner perimeter identified by reference number 23 in FIG. 3.

FIG. 7 is a side cross-sectional view of an apparatus for engaging a sealing plate 25 to the slit/opening 24 in the substrate of the IC chip 5, which can be a component of a tray or fixture in the vacuum chamber for the steps of applying the vacuum, as described with reference to FIG. 2, and then capping the slit/opening 24, as described with reference to FIG. 4.

The plate 25 can be moved upwards or downwards along the Z-axis. The plate 25 may be a component of a plate assembly 30 that may be composed of a metal base material. The plate assembly 35 may include a plurality of plates 25, in which each plate corresponds to a IC chip being housed in a tray fixture 40. The plates 25 may be joined by a connecting plate linkage 26, and each plate 25 may be present on a stanchion 27 connecting the plate 25 to the connecting plate linkage 26.

FIGS. 8 and 9 illustrate magnified view of the plate 25 as engaged in sealing engagement to the slit/opening 24 of the IC chip 5. Each plate 25 may include a base 28 that may be composed of a metal. In the embodiment depicted in FIG. 8, the sealing member of the plate 25 may include a silicon adhesive layer 29 and a Polytetrafluoroethylene sheet 30. In the embodiment depicted in FIG. 9, the base 28 may include a ridge at its perimeter and a centrally positioned trench. The sealing member for sealing the slit/opening 24 may include a porous silicon rubber structure 31 that is present within the trench of the base 28, and a porous PTFE sheet 31 that is present on the silicon rubber structure 32. The assembly of the porous PTFE sheet 31 and the porous silicon rubber structure 31 can engage and seal the slit/opening 24 of the IC chip. A silicon adhesive o-ring 33 may be present on the ridge of the base 28. The silicon adhesive o-ring 33 can contact a portion of the substrate of the IC chip 15 surrounding the slit/opening 24 when the slit/opening is sealed by the assembly of the porous PTFE sheet 31 and porous silicon rubber structure 31. It is noted that the sealing structures of the plates 25 that have been described with reference to FIGS. 8 and 9 are illustrative of some embodiments of the present disclosure. It is not intended that the present disclosure be limited to only these examples. The plate structures can include enough space to allow for gasses to escape, etc.

Tray fixture 40 can house the assembly of the IC chip 5 that has been bonded to the supporting substrate 15 during the process sequence for removing voids from the underfill material 20 that is present with the solder bumps 10. In some embodiments, the IC chip 5 may be present between a back housing identified by reference number 43, and a front housing identified by reference number 42. The front housing 42 has openings present therethrough through with the plates 25 can travel to engage the slit/openings 24 during the process sequence for removing voids from the underfill 20. The assembly of the front housing 42 and the back housing 43 may be engaged to an actuating structure that includes a spring set bar 54 (not shown in FIG. 7) and spring lock bar 41. The interaction of the spring set bar 54 and the spring lock bar 41 are described with more detail with reference to FIGS. 10 and 11.

The sample, i.e., the IC chip 5, may be housed within a tray fixture 40. The plate 25 may be guided by glide pins 34 along the Z-axis into engagement with the sample that is in a fixed position within the tray fixture 26, e.g., in a fixed position between the front housing 42 and the rear housing 43. The tray fixture 26 being mounted within a vacuum chamber. The ends of the guide pins 34 may include actuators 50. The actuators 50 may be electrical or temperature triggered actuators 50. As illustrated in FIGS. 10 and 11, the actuators 50 may employ a spring pin design, in which a lock 53 may be switched to a closed to open position to actuate the plates 25 in sealing the slit/opening 24. An electrical signal or temperature signal may be employed to switch the locks 53 from the open to closed position. FIG. 10 illustrates and actuator 50 with the lock 53 in the closed position. In this position, the plates 25 are not sealed to the holes/openings 24. FIG. 11 illustrates the actuator 11 with the lock in the open position. In this position, the plates 25 are sealed to the holes/openings 24.

FIG. 10 illustrates one embodiment of a spring pin actuator 50 including a spring 51 that is positioned between a spring set bar 54 and a spring retainer 52 on the guide pin 34. The spring 51 may be a bimetal spring. The guide pin 34 passes through a hole in the spring set bar 54, and is in sliding relationship with the spring set bar 54. The spring retainer 52 is in a fixed position on the guide pin 34. The end of the guide pin 34 extends through an opening in the spring lock bar 41. In FIG. 10, the spring 51 is compressed, as the end of the guide pin 34 is recessed within the spring lock bar 41, and is retained by the spring lock 53, which is in the closed position. The opposing side of the guide pin 34 is connected to the connecting plate linkage 26. In the position depicted in FIG. 10, the spring 51 is compressed and the connecting plate linkage 26 is extended to its greatest degree, which positioned the plates 25 away from the slit/openings 24. This is consistent with the positioning of the plate in FIG. 2, during which the vacuum is applied to the structure including the underfill 20 having the void 7 present therein. Applying the vacuum reduces the size of the void as depicted in FIG. 2, when compared to FIG. 1.

In FIG. 11, the lock 53 of the actuator 50 is moved to an open position. At this position, the end of the guide pin 34 is not retained with the spring lock bar 41. Under this circumstance, the force that was retaining the spring 51 in the relaxed position is released. The spring 51 relaxes from its compressed state. The relaxation of the spring 51 applied an upward force on the spring retainer 52 of the guide pin 34, forcing the guide pin 34 to travel upward along the Z-axis. The guide pin 34 being attached to the connecting plate linkage 26 pulls the plates 25 into sealing engagement with the slits/holes 24. This is consistent with the positioning of the plate in FIGS. 4 and 5, during which the vacuum is still applied to the structure while the slit/holes 24 are sealed, and during the application of the curing temperatures. Curing reduces the size of the void as depicted in FIG. 5, when compared to FIG. 2.

Figure 12:
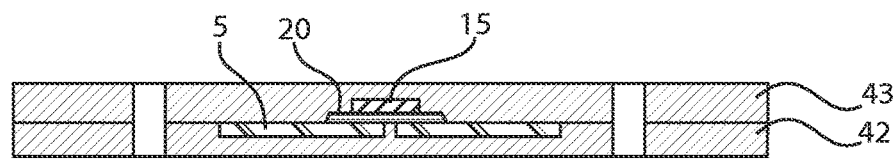
FIG. 12 is a side cross-sectional view of an assembly of an IC chip and supporting substrate that are bonded together using solder bumps loaded into a tray fixture, in accordance with one embodiment of the present disclosure.

FIGS. 12-18 depict one embodiment of employing an example tray fixture 40 with the method described with reference to FIGS. 1-6. Referring first to FIG. 12, an assembly of an IC chip 5 and supporting substrate 15 that are bonded together using solder bumps 10 is first loaded into the tray fixture 40. At this stage of the process flow the underfill 20 has been disposed around a perimeter of the IC chip 5, but a substantial void 7 may be present in the space between the solder bumper 10, the IC chip 5 and the supporting substrate. A slit/opening 34 may be present through the substrate of the IC chip 5, and may be in communication with the air gap of the void 7. The back housing 43 may contact the supporting substrate 15, while the front housing 42 contacts the IC chip side of the IC chip 5 and supporting substrate 15 assembly. The front housing 42 may include an opening present therethrough through with the plates 25 can travel to engage the slit/openings 24 during the process sequence for removing voids from the underfill 20. There are also openings present for the later positioned guide pins 34, and actuators 50.

Figure 13:
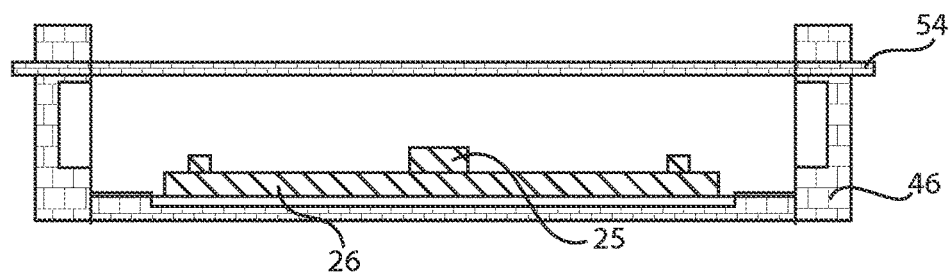
FIG. 13 is a side cross-sectional view of an assembly of an IC chip and supporting substrate that are bonded together using solder bumps loaded into a tray fixture, in accordance with one embodiment of the present disclosure.

FIG. 13 illustrates a tray fixture housing 46 that may be positioned within a vacuum chamber. At the base of the tray fixture housing 46, the assembly of the plates 25 and the connecting plate linkage 26 is position, and at an opposing surface of the tray fixtures housing 45, the spring set bar 54 is positioned.

Figure 14:
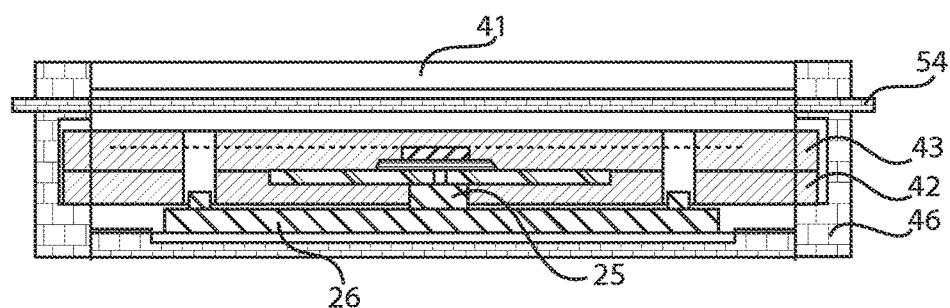
FIG. 14 is a side cross-sectional view illustrating the assembly of the back housing and the front housing containing the assembly of the IC chip and the supporting substrate being engaged to retailing slots of the sidewall of the tray fixture housing 46

FIG. 14 illustrates the assembly of the back housing 43 and the front housing 42 containing the assembly of the IC chip 5 and the supporting substrate 15 being engaged to retailing slots of the sidewall of the tray fixture housing 46. The assembly of the back housing 43 and the front housing 42 containing the assembly of the IC chip 5 and the supporting substrate is positioned between the spring set bar 54 and the assembly of the plates 25 and the connecting plate linkage 26.

Figure 15:
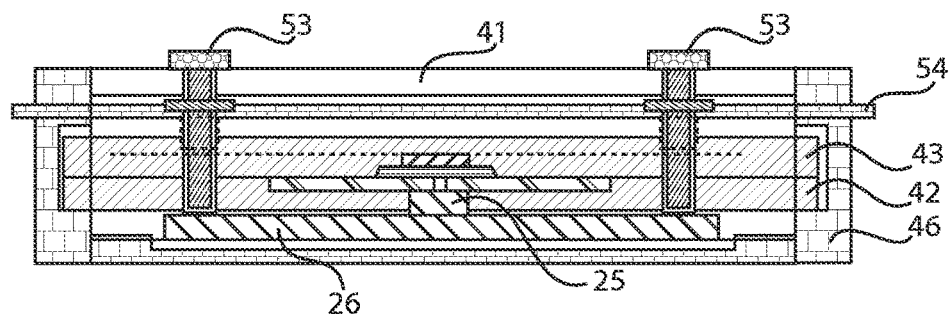
FIG. 15 is a side cross-sectional view illustrating connecting the spring lock bar to the side of the tray fixture housing, and engaging the actuators and guide pins to the connecting plate linkage 26, in accordance with one embodiment of the present disclosure.

FIG. 15 illustrates connecting the spring lock bar 41 to the side of the tray fixture housing 46 that is opposite the location of the assembly of the plates 25 and connecting plate linkage 26. FIG. 15 also illustrates engaging the actuators 50 and guide pins 34 to the connecting plate linkage 26, and engaging the spring retainer 52 on the guide pins 34 to the spring set bar 54. At this point the spring 51 may be in a relaxed state. A force may be applied to the end of the guide pin 34 that is opposite the side that is engaged to the connecting plate linkage 26 to compress the spring 51. Compressing the spring 51, and engaging the lock 53, provides that the plate 25 is separated from the slit/opening 24, as depicted. The positioning of the plate 25 relative to the slit/opening 24 is consistent with the application of the vacuum that is described with reference to FIG. 2. As described with reference to FIG. 2 above, the application of the vacuum reduces the size of the void 7' in the underfill 20 when compared to the size of the void prior to the application of the vacuum, as depicted in FIG. 1.

Figure 16:
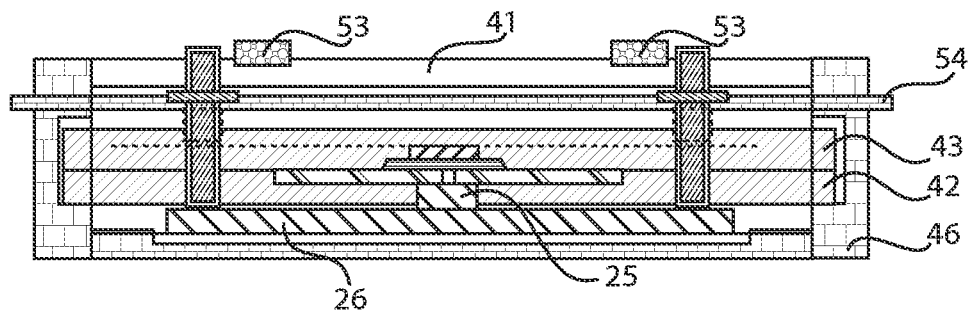
FIG. 16 is a side cross-sectional view illustrating opening the lock to release the retaining force on the guide pin to cause the guide pin to move upwards, and pull the plates into sealing engagement with the slits/holes, in accordance with one embodiment of the present disclosure.

FIG. 16 illustrates one embodiment of opening the lock 53. Opening the lock 53, releases the retaining force on the guide pin 34. Releasing the retaining force of the guide pin 34 allows the spring to relax (decompress), which causes the guide pin 34 to move upwards along the Z-direction in FIG. 16. The end of the guide pin 34 that is opposite the end at which the retaining lock 53 may engage is connected to the connecting plate linkage 26. The connecting plate linkage 26 is connected to the plates 25. Opening the lock 53 allows the spring to relax providing the force for pulling the connecting plate linkage 26 upward along the Z-direction, which pulls the plates 25 into sealing engagement with the slits/holes 24. This is consistent with the positioning of the plate in FIGS. 4 and 5, during which the vacuum is still applied to the structure while the slit/holes 24 are sealed, and during the application of the curing temperatures.

The actuators for the locks 53 may be electrical or temperature triggered. In some scenarios, the vacuum chamber may not have electric wiring at the interior of the chamber. In this example, an actuator can be provided that does not relying upon electric signals and servomotor to employ locks 53.

Figure 17:
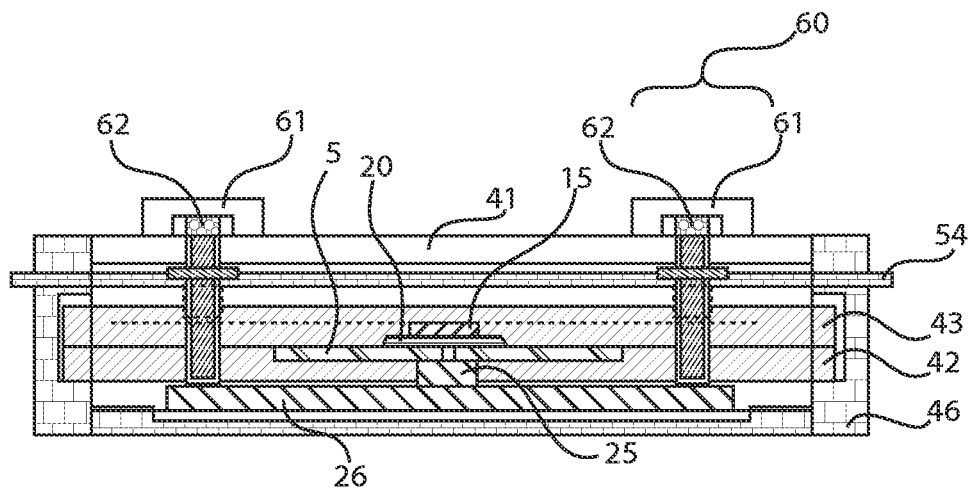
FIG. 17 is a side cross-sectional view illustrating a solder pin assembly that can provide a locking mechanism that allows for a compressed spring to decompress for the plates to come into sealing engagement with the slit/opening, in accordance with one embodiment of the present disclosure.
Figure 18:
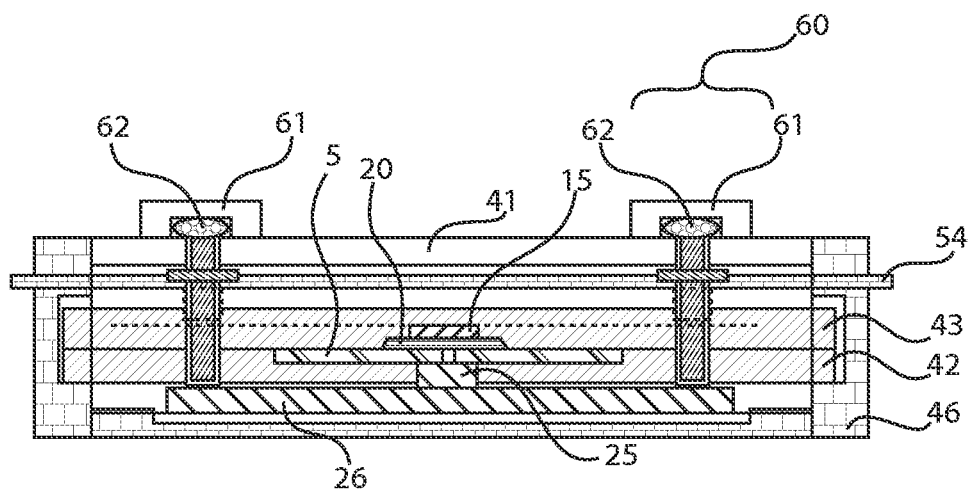
FIG. 18 is a side cross-sectional view illustrating melting the solder in the solder pin assembly depicted in FIG. 17.

Referring to FIGS. 17 and 18, in some embodiments, a solder pin assembly 60 can provide the locking mechanism that allows for the compressed spring 51 to decompress, and engage the plates 25 in sealing engagement with the slit/opening 24. The solder pin assembly 60 can include a solder retaining housing 61 and a solder ball 62. The solder pin assembly 60 may be substituted for the locks 53 that are depicted in FIGS. 10 and 11, as well as FIGS. 15 and 16. The solder retaining housing 61 is present on the spring lock bar 41, and is present overlying the end of the guide pin 34 that is retained in order to compress the spring 51. The solder 62 is present atop the end of the guide pin 34 and is enclosed within the solder retaining housing 61. In the solder pin example, solder pin 60 is used to open the spring lock by using temperature trigger (above melting temperature of the solder 62) instead of electric signal. The solder 62 may have a composition of any of the compositions for the types of solders that have been described above for providing the solder bumps 10.

Below the melting temperature of the solder 62, the solder is in a solid matter state, which when pressed between the back wall of the solder retaining housing 61 and the upper surface of the guide pin 34 maintains the spring 51 in its compressed state. Compressing the spring 51 provides that the plate 25 is separated from the slit/opening 24, as depicted in FIG. 17. The positioning of the plate 25 relative to the slit/opening 24 is consistent with the application of the vacuum that is described with reference to FIG. 2. As described with reference to FIG. 2 above, the application of the vacuum reduces the size of the void 7' in the underfill 20 when compared to the size of the void prior to the application of the vacuum, as depicted in FIG. 1.

As the temperature is raised to the melting temperature of the solder 61, the solder 61 is melted to release the tray so that the springs 51 cause the plates 25 to seal the vacuum holes, e.g., slits/openings 24, in the substrate 5.

Figure 19:
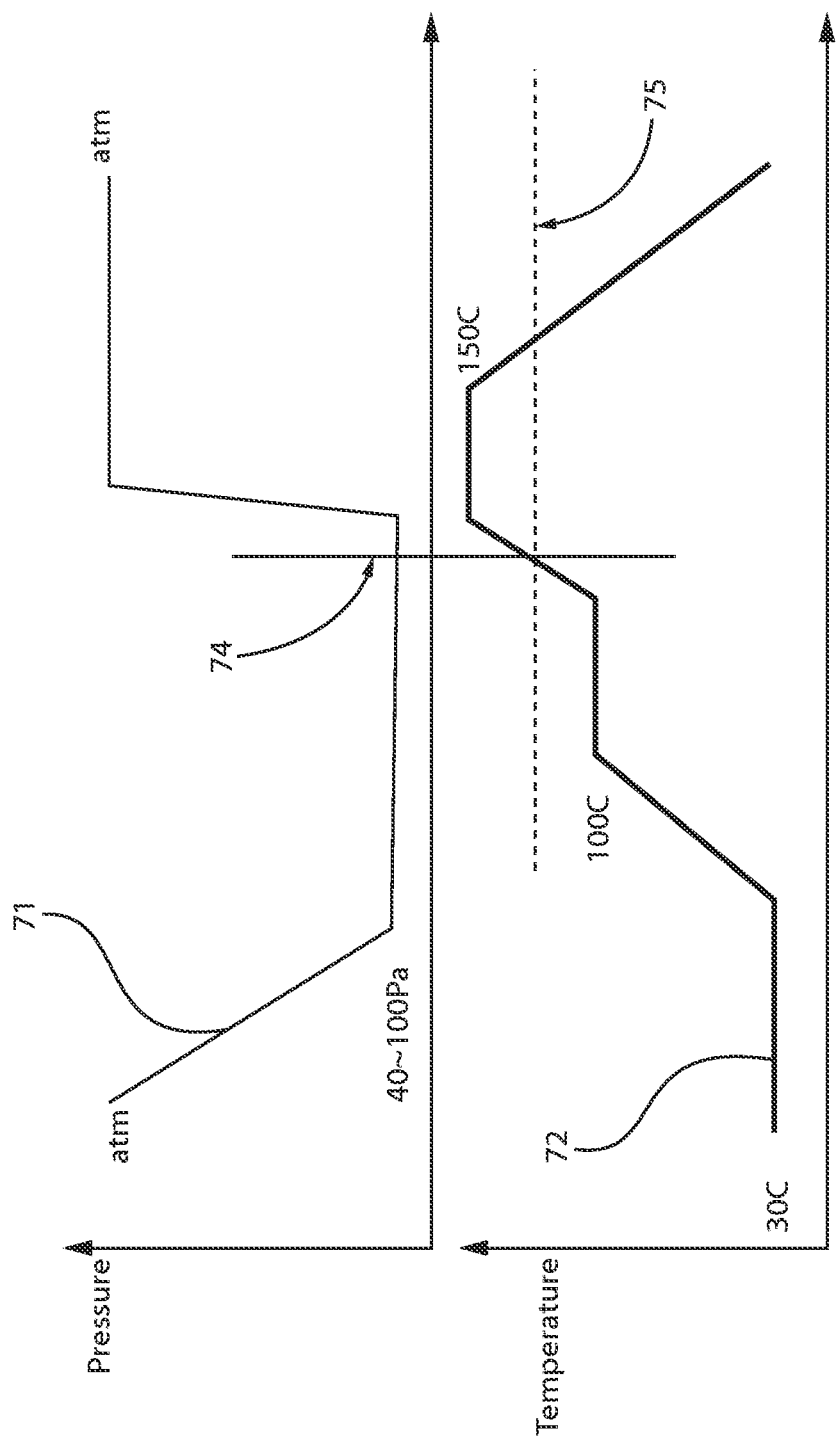
FIG. 19 is a plot illustrating one embodiment of pressure and temperature profiles that provide for melting the solder for the solder pin designs depicted in FIGS. 17 and 18 at the appropriate timing with the sequence for sealing the slits/openings, as described with reference to FIGS. 1-6.

FIG. 19 illustrates pressure and temperature profiles that provide for melting the solder 61 at the appropriate timing with the sequence for sealing the slits/openings as described with reference to FIGS. 1-6. Plot line 71 is a pressure profile. Plot line 72 is a temperature profile. For example, the intersection of the lines for when the voids are closed identified by reference number 74, and the line for when the solder 61 melts at reference number 75, illustrates the temperature and pressure for melting the solder 61. The temperature and pressure illustrated in FIG. 19 are suitable for at least one embodiment of triggering the plates 25 to seal the slits/openings 24 as described in FIG. 4 for the method sequence described with reference to FIGS. 1-6.

It is noted that the methods and apparatuses described herein are applicable to any electrical device that includes underfill materials, e.g., devices that employ solder bonds to provide electrical communication between two structures, in which the solder bonds are insulated and mechanically reinforced with a dielectric underfill.

Figure 20:
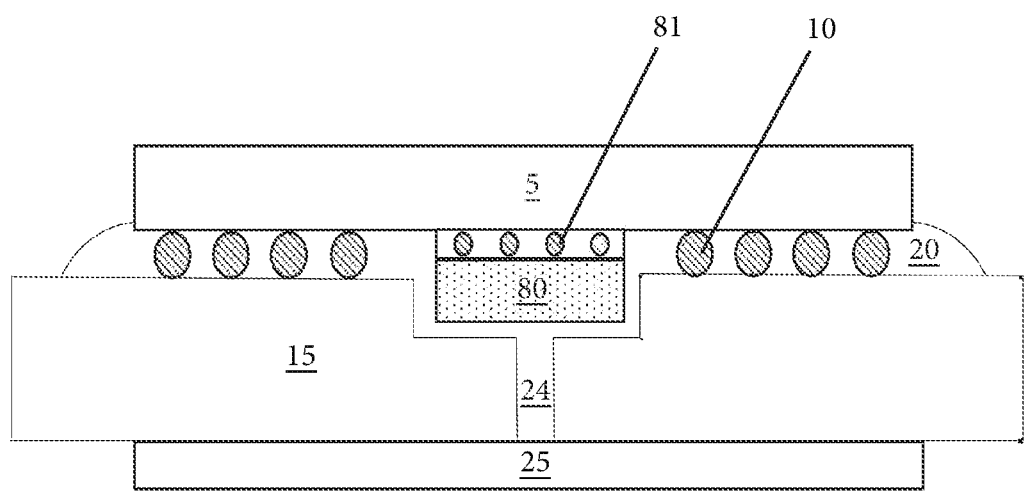
FIG. 20 is a side cross-sectional view depicting one embodiment of direct bonded heterogeneous integration (DBHi) structure, in which the underfill material has been processed to provide an underfill that is entirely free of voids and airgaps.

FIG. 20 illustrates one embodiment of direct bonded heterogeneous integration (DBHi) structure, in which the underfill material 20 has been processed as described with reference to FIGS. 1-19 to provide an underfill that is entirely free of voids and airgaps. In the embodiment depicted in FIG. 20, a first integrated circuit chip (IC) chip 5 is bonded to a supporting substate 15 through solder bumps 10. The first integrated circuit (IC) chip 5 may be composed of a semiconductor substrate, such as a type IV semiconductor, e.g., silicon, or a type III-V semiconductor GaAs. The first integrated circuit (IC) chip 5 may include a plurality of doped regions and gate structures to provide any number of field effect transistors. The first integrated circuit (IC) chip 5 may also include passive electrical devices, such as capacitors and resistors. The supporting substrate 15 may be a printed circuit board (PCB). The supporting substrate 15 may be a laminated structure, e.g., polymeric, and may have a plurality of electrical pathways present thereof. In other examples, the supporting substrate 15 may be composed of a glass. In even further examples, the supporting substrate may be another semiconductor material, such as a type IV semiconductor, e.g., silicon, or a type III-V semiconductor GaAs. To provide for electrical communication between the supporting substrate 15 and the first integrated (IC) chip 5 solder bumps 10 may be present therebetween in direct electrical contact with the electrical passageways of the first IC chip 5, and the supporting substrate 15. The solder bumps 10 bond, i.e., fused metal connection, the first IC chip 5 and the supporting substrate 15 together.

In the embodiment depicted in FIG. 20, a second integrated circuit chip (IC chip) 80 is present between the first IC chip 5 and the supporting substrate. The second integrated circuit chip 80 may be a bridge chip. The bridge chip may be composed of a semiconductor substrate, such as a type IV semiconductor, e.g., silicon, or a type III-V semiconductor GaAs. The bridge chip may include a plurality of doped regions and gate structures to provide any number of field effect transistors. The bridge chip may also include passive electrical devices, such as capacitors and resistors.

To provide for electrical communication between the bridge chip (second integrated circuit (IC) chip 80)) and the first integrated (IC) chip 5, solder bumps 81 may be present therebetween in direct electrical contact with the electrical passageways of the first IC chip 5, and the bridge chip (second integrated circuit (IC) chip 80)). The solder bumps 10 bond, i.e., fused metal connection, the first IC chip 5 and the bridge chip (second integrated circuit (IC) chip 80)) together in electrical communication.

An underfill material 20 is present isolating the solder bumps 10 from one another, and providing structural rigidity to the bonded connection of the multiple chips and substrates depicted in FIG. 20. The underfill material 20 is present completely filling the spacer between the adjacently positioned solder bonds 10, as well as completely filling the space between the supporting substrate 15 and the first integrated circuit (IC) chip 5. As illustrated, the underfill material 20 is completely filing the space between the supporting substrate 15 and the second integrated circuit (IC) chip 80, e.g., bridge chip. The underfill material 20 is completely free of air gaps, e.g., voids.

To provide that the underfill material 20 is completely free of voids and vacuum and curing method is applied to the structures using the methods described with reference to FIGS. 1-19. To apply the vacuum, a slit/opening 24 is present through at least one of the first IC chip 5 and the supporting substrate 15. Although only one hole 24 is depicted, it is noted that the present disclosure is not limited to only this example, any number of holes and/or slits may be present so long as their number and geometry allow for the application of a vacuum, as well as the sealing using a plate structure 25 (as described with reference to FIGS. 1-19, and to allow for being permanently sealed with underfill material 20, as depicted in FIG. 20.

It is noted that FIG. 20 illustrates the plate 25 sealing the opening/slit 24. This is provided for illustrative purposes. In a final device structure, the plate 25 would not be present. In some examples, a ball grid array (BGA) array or other surface mount structure may be present at the location of the plate 25 in FIG. 20.

It is noted that although, the slit/opening 24 is depicted in FIG. 20 as being present through the entirety of the thickness of the supporting substrate 15, the methods and structures of the present disclosure are not limited to only this example. For example, FIGS. 1-6 illustrate that the slit/opening being formed through the IC chip 15. The slit/opening 24 can be formed using etching processes.

The methods and structures of the present disclosure provide that the slit/opening 24 is also filled with underfill material 20. The underfill material 20 may fill the entirety of the slit/opening 24, which is one distinguishable feature of the structure disclosed herein from prior devices that employ underfill materials. In some embodiments by being entirely filled with underfill material 20, in a final device structure the slit/opening 24 is entirely free of voids and/or air gaps.

The composition of the underfill material 20 depicted in FIG. 20 has been described above with reference to FIGS. 1-19. Therefore, the description of the underfill material 20 described with reference to FIGS. 1-19 is equally applicable for the underfill composition of the underfill material that is depicted in FIG. 20 and identified by the same reference number, i.e., "20".

While the methods and structures of the present disclosure for an underfill vacuum process have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

The invention claimed is:

1. An apparatus for forming an electrical device:
a tray fixture for housing an assembly of an integrated circuit engaged to a support substrate by solder bond and an underfill material, wherein the tray fixture includes an aperture to expose at least one vacuum opening in the assembly;
a sealing plate positioned to be inserted into the aperture; and
at least one actuator connected to the tray fixture and the sealing plate to move the sealing plate into engagement with the at least one vacuum opening in the assembly.

2. The apparatus of claim 1, wherein the at least one actuator comprises at least one guide pin connected to the tray fixture and the sealing plate; and a spring for moving the sealing plate through the aperture in the tray fixture.

3. The apparatus of claim 1, wherein the at least one actuator further includes a spring retainer on the at least one guide pin for connecting the spring to the at least one guide pin; and a spring set bar on the tray fixture for connecting the spring to the tray fixture.

4. The apparatus of claim 1, wherein the actuator includes a servo motor that is electrically triggered.

5. An apparatus for forming an electrical device:
a tray fixture for housing an assembly of an integrated circuit engaged to a support substrate by solder bond and an underfill material, wherein the tray fixture includes an aperture to expose at least one vacuum opening in the assembly;
a sealing plate positioned to be inserted into the aperture; and
at solder actuator connected to the tray fixture and the sealing plate to move the sealing plate into engagement with the at least one vacuum opening in the assembly.

6. The apparatus of claim 5, wherein the solder actuator comprises at least one guide pin connected to the tray fixture and the sealing plate; and a spring for moving the sealing plate through the aperture in the tray fixture.

7. The apparatus of claim 6, wherein the solder actuator further includes a spring retainer on the at least one guide pin for connecting the spring to the at least one guide pin; and a spring set bar on the tray fixture for connecting the spring to the tray fixture.

8. The apparatus of claim 7, wherein the spring is compressed when the solder of the solder actuator is in a solid state and the sealing plate is separated from the at least one vacuum opening, and the spring is decompressed when the solder is in a liquid state and the sealing plate is engaged to the at least one vacuum opening.

\* \* \* \* \*